(12) United States Patent
Kemen et al.

(10) Patent No.: US 10,784,070 B2
(45) Date of Patent: Sep. 22, 2020

(54) CHARGED PARTICLE BEAM DEVICE, FIELD CURVATURE CORRECTOR, AND METHODS OF OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventors: Thomas Kemen, Meppen (DE); Benjamin John Cook, Munich (DE); Roman Barday, Poing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/165,193

(22) Filed: Oct. 19, 2018

(65) Prior Publication Data
US 2020/0126751 A1    Apr. 23, 2020

(51) Int. Cl.
| | |
|---|---|
| *H01J 37/07* | (2006.01) |
| *H01J 37/317* | (2006.01) |
| *H01J 37/28* | (2006.01) |
| *H01J 37/244* | (2006.01) |

(52) U.S. Cl.
CPC ............ *H01J 37/07* (2013.01); *H01J 37/28* (2013.01); *H01J 37/3177* (2013.01); *H01J 37/244* (2013.01); *H01J 2237/1516* (2013.01)

(58) Field of Classification Search
None
See application file for complete search history.

(56) References Cited

U.S. PATENT DOCUMENTS

| | | | |
|---|---|---|---|
| 8,039,813 B2 | 10/2011 | Casares et al. | |
| 2008/0054184 A1* | 3/2008 | Knippelmeyer | B82Y 10/00 250/396 ML |
| 2013/0248731 A1 | 9/2013 | Tanimoto et al. | |

(Continued)

FOREIGN PATENT DOCUMENTS

JP    2007-123599 A    5/2007

OTHER PUBLICATIONS

International Search Report and Written Opinion for Application No. PCT/EP2019/073465, dated Dec. 4, 2019, 15 pages.

*Primary Examiner* — James Choi
(74) *Attorney, Agent, or Firm* — Kilpatrick Townsend & Stockton LLP

(57) ABSTRACT

A charged particle beam device is described, which includes: a beam source configured to generate a charged particle beam propagating along an optical axis (A); an aperture device with a plurality of apertures configured to create a plurality of beamlets from the charged particle beam; and a field curvature corrector. The field curvature corrector includes: a first multi-aperture electrode with a first plurality of openings having diameters that vary as a function of a distance from the optical axis (A); a second multi-aperture electrode with a second plurality of openings; and an adjustment device configured to adjust at least one of a first electrical potential (U1) of the first multi-aperture electrode and a second electrical potential (U2) of the second multi-aperture electrode. Further, a field curvature corrector and methods of operating a charged particle beam device are described.

16 Claims, 7 Drawing Sheets

(56) References Cited

U.S. PATENT DOCUMENTS

| | | | |
|---|---|---|---|
| 2013/0299697 A1* | 11/2013 | Enyama | H01J 37/12 |
| | | | 250/307 |
| 2013/0341526 A1* | 12/2013 | Ohashi | H01J 3/18 |
| | | | 250/396 R |
| 2018/0025886 A1* | 1/2018 | Shirasaki | H01J 37/153 |
| | | | 250/396 R |

* cited by examiner

CHARGED PARTICLE BEAM DEVICE, FIELD CURVATURE CORRECTOR, AND METHODS OF OPERATING A CHARGED PARTICLE BEAM DEVICE

TECHNICAL FIELD

Embodiments described herein relate to charged particle beam devices, and particularly to scanning electron microscopes configured to inspect specimens such as wafers or other substrates, e.g. to detect pattern defects. More specifically, embodiments described herein relate to charged particle beam devices configured to utilize multiple charged particle beams, e.g. a plurality of electron beamlets, particularly for inspection system applications, testing system applications, defect review or critical dimensioning applications, surface imaging applications or the like. Embodiments further relate to field curvature correctors and to methods of operating charged particle beam devices.

BACKGROUND

Modern semiconductor technology has created a high demand for structuring and probing specimens in the nanometer or even in the sub-nanometer scale. Micrometer and nanometer scale process control, inspection or structuring is often done with charged particle beams, e.g. electron beams, which are generated, shaped, deflected and focused in charged particle beam devices, such as electron microscopes. For inspection purposes, charged particle beams offer superior spatial resolution compared to, e.g., photon beams, because their wavelengths are shorter than the wavelengths of light beams.

Inspection devices using charged particle beams such as scanning electron microscopes (SEM) have many functions in a plurality of industrial fields, including, but not limited to, inspection of electronic circuits, exposure systems for lithography, detecting devices, defect inspection tools, and testing systems for integrated circuits. In charged particle beam systems, fine probes with high current density can be used. For instance, in the case of an SEM, the primary electron beam generates signal charged particles like secondary electrons (SE) and/or backscattered electrons (BSE) that can be used to image and analyze a specimen.

One drawback of electron-beam based systems is the limited probe current within the focused spot. Higher brightness sources can provide only limited improvements for the probe current due to the electron-electron interactions. Many approaches have been made to reduce e-e interactions in electron beam systems, which are, for example, reduced column length and/or higher column energy combined with late deceleration of the electron beam to the final landing energy just in front of the sample. However, improving the electron beam throughput at a high resolution is increasingly challenging.

One approach to solve such problems is the use of multiple beams (also referred to herein as beamlets) in a single column. Directing, scanning, deflecting, shaping, correcting, and/or focusing individual beamlets of a multi-beam system is, however, challenging, in particular when sample structures are to be scanned and inspected in a quick manner with a high throughput on a nanoscale resolution. In particular, correcting aberrations, such as a field curvature, of multiple beams in a single column is challenging. What is more, the beam aberrations may depend on the working mode of the charged particle beam device, which makes a reliable compensation of beam aberrations even more difficult.

Accordingly, it would be beneficial to provide charged particle beam devices configured as multi-beam systems which provide a high throughput and good field qualities to be used for inspecting sample structures. In particular, it would be beneficial to provide a charged particle beam device configured for multi-beam operation with reduced aberrations in different working modes of the charged particle beam device.

SUMMARY

In light of the above, according to the independent claims, a charged particle beam device, a field curvature corrector as well as methods of operating a charged particle beam device are provided. Further aspects, advantages, and features of the embodiments are apparent from the dependent claims, the description, and the accompanying drawings.

According to one aspect described herein, a charged particle beam device is provided. The charged particle beam device includes a beam source configured to generate a charged particle beam propagating along an optical axis, an aperture device with a plurality of apertures configured to create a plurality of beamlets from the charged particle beam, and a field curvature corrector. The field curvature corrector includes a first multi-aperture electrode with a first plurality of openings for the plurality of beamlets, the first plurality of openings having diameters that vary as a function of a distance from the optical axis, a second multi-aperture electrode with a second plurality of openings for the plurality of beamlets, and an adjustment device configured to adjust at least one of a first electrical potential of the first multi-aperture electrode and a second electrical potential of the second multi-aperture electrode.

According to a further aspect described herein, a field curvature corrector is provided. The field curvature corrector includes a first multi-aperture electrode with a first plurality of openings for a plurality of beamlets of charged particles propagating next to each other. The first plurality of openings have varying diameters. The field curvature corrector further includes a second multi-aperture electrode with a second plurality of openings for the plurality of beamlets, and an adjustment device configured to adjust at least one of a first electrical potential of the first multi-aperture electrode and a second electrical potential of the second multi-aperture electrode.

According to a further aspect described herein, a scanning electron microscope (SEM) for imaging a specimen is provided. The scanning electron microscope includes a beam source configured to generate a beam of electrons propagating along an optical axis, a field curvature corrector for a plurality of beamlets of charged particles as described herein, and a scan deflector configured for scanning the plurality of beamlets over the specimen.

According to a further aspect described herein, a method of operating a charged particle beam device configured for the inspection of a specimen with a plurality of beamlets is provided. The method includes adjusting a field curvature corrector to a first working mode of the charged particle beam device, and operating the charged particle beam device in the first working mode. The method further includes adjusting the field curvature corrector to a second working mode of the charged particle beam device, and operating the charged particle beam device in the second working mode.

According to a further aspect described herein, a method of operating a charged particle beam device is provided. The method includes generating a charged particle beam propagating along an optical axis, creating a plurality of beamlets from the charged particle beam, compensating a field curvature with a field curvature corrector, and focusing the plurality of beamlets onto a specimen. Compensating the field curvature includes focusing the plurality of beamlets with a first multi-aperture electrode having a first plurality of openings with a varying diameter, and adjusting at least one of a first electrical potential of the first multi-aperture electrode and a second electrical potential of a second multi-aperture electrode with a second plurality of openings.

According to an aspect described herein, a charged particle beam device is provided, including a beam source for generating a charged particle beam, and a field curvature corrector. The field curvature corrector includes a first multi-aperture electrode with a first plurality of openings having varying diameters, a second multi-aperture electrode with a second plurality of openings, and an adjustment device for adjusting at least one of a first electrical potential of the first multi-aperture electrode and a second electrical potential of the second multi-aperture electrode.

Embodiments are directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of embodiments, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Semiconductor technology is dependent on an accurate control of the various processes used during the production of integrated circuits. For example, substrates such as wafers and masks have to be inspected repeatedly, in order to localize problems or defects. A mask or reticle has to be inspected before actual use during substrate processing, in order to make sure that the mask accurately defines a predetermined pattern. Any defect in the mask pattern would be transferred to the substrate during use in microlithography. The inspection of a specimen such as substrates, wafers or masks for defects typically includes the examination of a large surface area in a comparably short time. The inspection should be as fast as possible, in order to avoid a reduction of the production throughput by the inspection process.

Scanning electron microscopes (SEMs) can be used to inspect a specimen to detect defects such as pattern defects. The surface of the specimen is scanned using a charged particle beam, e.g. an electron beam, which may be focussed on the surface of the specimen. When the charged particle beam hits the specimen, secondary charged particles (e.g., secondary electrons) are generated and detected. A pattern defect at a location of the specimen can be detected by comparing an intensity signal of the secondary charged particles to, e.g., a reference signal corresponding to the same location of the specimen. When only one charged particle beam is used for scanning, scanning may take a considerable amount of time, and only a limited throughput may be obtainable.

The throughput may be increased by providing a charged particle beam device configured as a multi-beam system. In a multi-beam system, a plurality of beamlets of charged particles are generated which propagate next to each other in a column so that two or more spots on the specimen can be inspected simultaneously. However, controlling, shaping and correcting a plurality of beamlets which propagate at a close relative distance in one column is challenging. According to embodiments described herein, a charged particle beam device is provided which provides a high throughput and a high inspection accuracy at the same time.

Figure 1A:
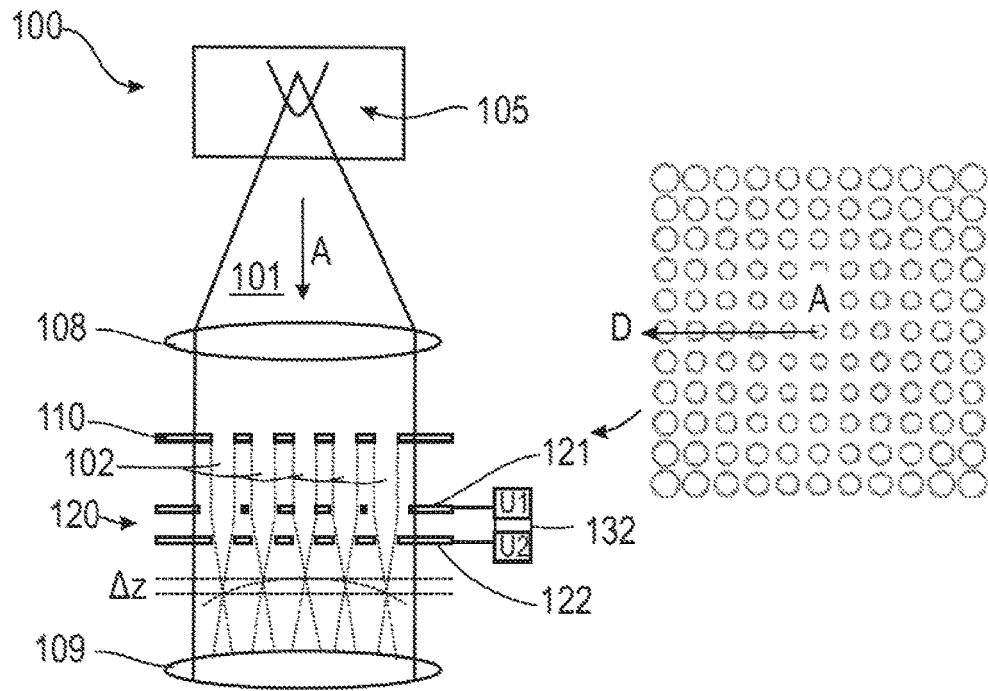
FIG. 1A is a schematic sectional view of a charged particle beam device according to embodiments described herein.

FIG. 1A is a schematic sectional view of a charged particle beam device 100 configured as a multi-beam device according to embodiments described herein.

The charged particle beam device 100 includes a beam source 105 configured to generate a charged particle beam 101 propagating along an optical axis A. The beam source 105 may be an electron source configured to generate an electron beam. Alternatively, the beam source may be an ion source configured to generate an ion beam. The charged particle beam 101 may propagate from the beam source 105 toward a specimen through a column along an optical axis A.

A plurality of beam influencing elements such as one or more deflectors, beam correctors, lens devices, apertures, beam benders and/or beam separators (not shown in FIG. 1A) may be arranged along the beam path between the beam source and the specimen. For example, a collimation lens system 108 may be arranged downstream of the beam source 105 for collimating the charged particle beam 101, and an objective lens system 109 may be arranged downstream of the collimation lens system 108 and upstream of the specimen.

In some embodiments, the beam source 105 may include at least one of a cold field emitter (CFE), a Schottky emitter, a thermal field emitter (TFE) or another high current electron beam source, in order to increase the throughput. A high current is considered to be 10 µA in 100 mrad or more, for example up to 5 mA, e.g. 30 µA in 100 mrad to 1 mA in 100 mrad. According to typical implementations, the current is distributed essentially uniformly, e.g. with a deviation of +/−10%. According to some embodiments, which can be combined with other embodiments described herein, the beam source can have a typical emission half angle of 5 mrad or above, e.g. 50 mrad to 200 mrad. In some embodiments, the beam source may have a virtual source size of 2 nm or more and/or 40 nm or less. For example, if the beam source is a Schottky emitter, the source may have a virtual source size from 10 nm to 40 nm. For example, if the beam source is a cold field emitter (CFE), the source may have a virtual source size from 2 nm to 20 nm.

According to embodiments, which can be combined with other embodiments described herein, a TFE or another high reduced-brightness source capable of providing a large beam current is a source where the brightness does not fall by more than 20% of the maximum value when the emission angle is increased to provide a maximum of 10 µA-100 µA. For example, Schottky or TFE emitters are currently available with a measured reduced-brightness of $5 \cdot 10^7$ $Am^{-2}(SR)^{-1}V^{-1}$, and CFE emitters have a measured reduced-brightness of up to $5 \cdot 10^9$ $Am^{-2}(SR)^{-1}V^{-1}$. For example, a beam which has at least $5 \cdot 10^7$ $Am^{-2}(SR)^{-1}V^{-1}$ is beneficial.

The charged particle beam device 100 may include an aperture device 110 with a plurality of apertures configured to create a plurality of beamlets 102 of charged particles from the charged particle beam 101. For example, the aperture device 110 may have three, five, ten or more apertures configured to create three, five, ten or more beamlets. In particular, the aperture device 110 may have fifty or more apertures for generating fifty or more beamlets. Each of the apertures of the aperture device 110 may be configured to create one beamlet of charged particles from the charged particle beam.

The aperture device 110 may include a plate in which the apertures are formed as beam limiting holes. When the charged particle beam 101 impinges on the plate having the apertures formed therein, charged particles can propagate through the apertures in the plate to form the plurality of beamlets, and a remaining part of the charged particle beam 101 may be blocked by the plate. In some embodiments, at least one surface of the aperture device 110, e.g. the surface of the aperture device 110 directed toward the beam source 105, may be a conductor or semiconductor surface in order to reduce or avoid an accumulation of charges on the aperture device 120.

It is noted that the aperture device 110 arranged upstream of the field curvature corrector 120 is an optional component and, in some embodiments, the plurality of beamlets 102 may be created from the charged particle beam 101 by a multi-aperture plate of the field curvature corrector. In other words, the aperture device and the field curvature corrector may be integrally formed in some embodiments.

According to embodiments described herein, the charged particle beam device further includes a field curvature corrector 120. The field curvature corrector 120 includes a first multi-aperture electrode 121 with a first plurality of openings for the plurality of beamlets, and a second multi-aperture electrode 122 with a second plurality of openings for the plurality of beamlets. The second multi-aperture electrode 122 may be arranged downstream or upstream of the first multi-aperture electrode 121, and the second plurality of openings may be aligned with the first plurality of openings and with the plurality of apertures of the aperture device 110, such that the plurality of beamlets propagate through the first and second pluralities of openings. Each of the multi-aperture electrodes may be provided as a plate element in which a plurality of openings are provided through which the plurality of beamlets can propagate.

According to embodiments described herein, the first multi-aperture electrode 121 provides a focusing effect on the plurality of beamlets 102, wherein the strength of the focusing effect on each beamlet depends on the distance of the respective beamlet from the optical axis A. In other words, the focusing effect provided by the first multi-aperture electrode 121 on a beamlet varies as a function of the distance from the optical axis A, such that a beamlet which is distant from the optical axis is focused differently from a beamlet that is close to the optical axis.

In particular, the first plurality of openings of the first multi-aperture electrode 121 may have diameters that vary as a function of a distance from the optical axis A. In some embodiments, the diameters of the first plurality of openings increase with an increasing distance D from the optical axis A, as is schematically depicted in FIG. 1A. In some embodiments, the diameters of the first plurality of openings decrease with an increasing distance D from the optical axis A.

The focusing effect of a conventional electrostatic lens which is configured as an opening in an electrode typically depends on the diameter of the opening which affects the electrical field difference on opposite sides of the electrode. More specifically, an electrode with a small opening may have a stronger focusing effect on a charged particle beam than an electrode with a larger opening. Accordingly, a multi-aperture electrode having varying opening diameters provides varying focusing effects on a plurality of beamlets propagating through the openings of the multi-aperture electrode. An increase in diameter of an opening results in a reduced electrical field strength and hence in a reduced electrical focusing power of the respective lens.

The focusing effect of the first multi-aperture electrode 121 schematically depicted in FIG. 1A decreases as a function of the distance of a beamlet from the optical axis. Accordingly, the first multi-aperture electrode 121 can be used for compensating a field curvature of the charged particle beam device in the plane of the specimen.

The field curvature corrector 120 according to embodiments described herein further includes an adjustment device 132 configured to adjust at least one of a first electrical potential U1 of the first multi-aperture electrode 121 and a second electrical potential U2 of the second multi-aperture electrode 122. By adjusting the first electrical potential U1 (and maintaining a constant second electrical potential U2), the electrical field between the first and second multi-aperture electrodes can be changed, such that the strength of the field curvature correction of the field curvature corrector can be adjusted. By adjusting the second electrical potential U2 of the second multi-aperture electrode 122 (and maintaining a constant first electrical potential U1), the electrical field between the first and second multi-aperture electrodes can be changed, and the strength of the field curvature correction of the field curvature corrector can be adjusted. Further, by adjusting both the first electrical potential U1 and the second electrical potential U2 (e.g., increasing the first electrical potential U1 and decreasing the second electrical potential U2, or vice versa), the strength of the field curvature correction of the field curvature corrector can be even more flexibly adjusted.

Embodiments described herein target the correction of the field curvature of a multi-beam charged particle system, and in particular the adjustment of the amount of the field curvature correction. Different working modes of the charged particle beam device may differ in various settings and beam parameters, e.g. in the landing energy of the charged particles on the specimen and/or in the working distance between the objective lens system and the specimen. Accordingly, the field curvature that is caused by the optical components in a charged particle beam device may depend on the working mode in which the charged particle beam device is operated.

Accordingly, it is beneficial to provide a field curvature corrector 120 that can be adjusted such that an appropriate amount of field curvature correction is provided on a plurality of beamlets, depending on the working mode in which the charged particle beam device is operated.

Figure 2:
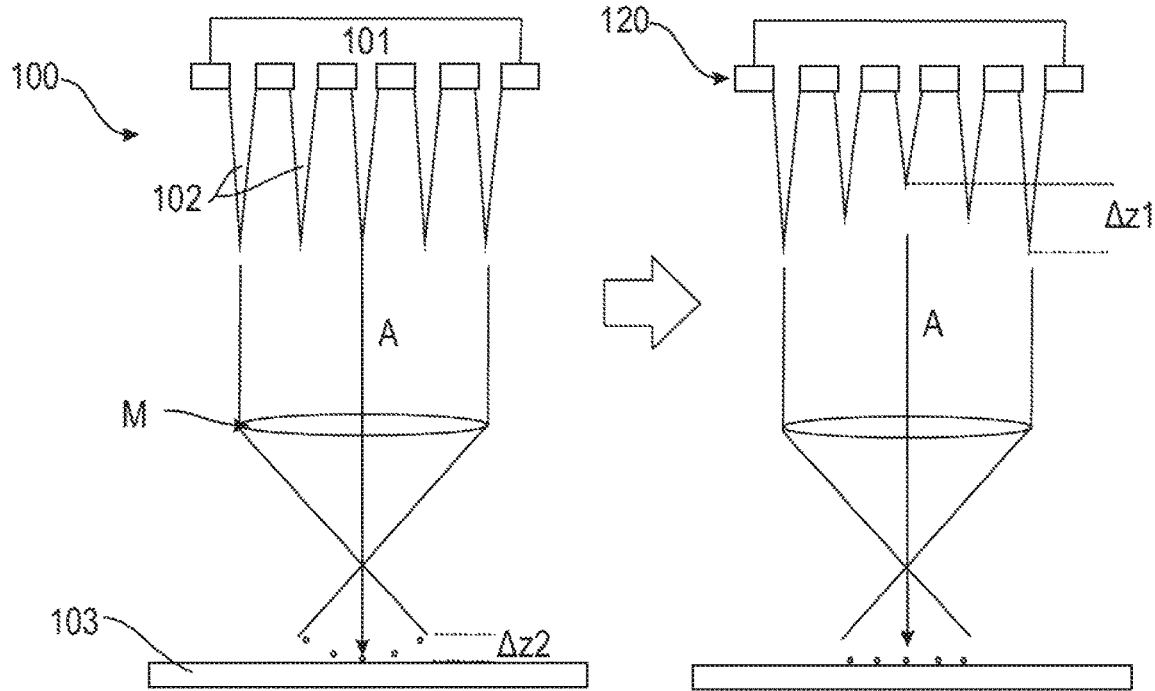
FIG. 2 is a schematic view for illustrating a field curvature correction in a first working mode of a charged particle beam device.
Figure 3:
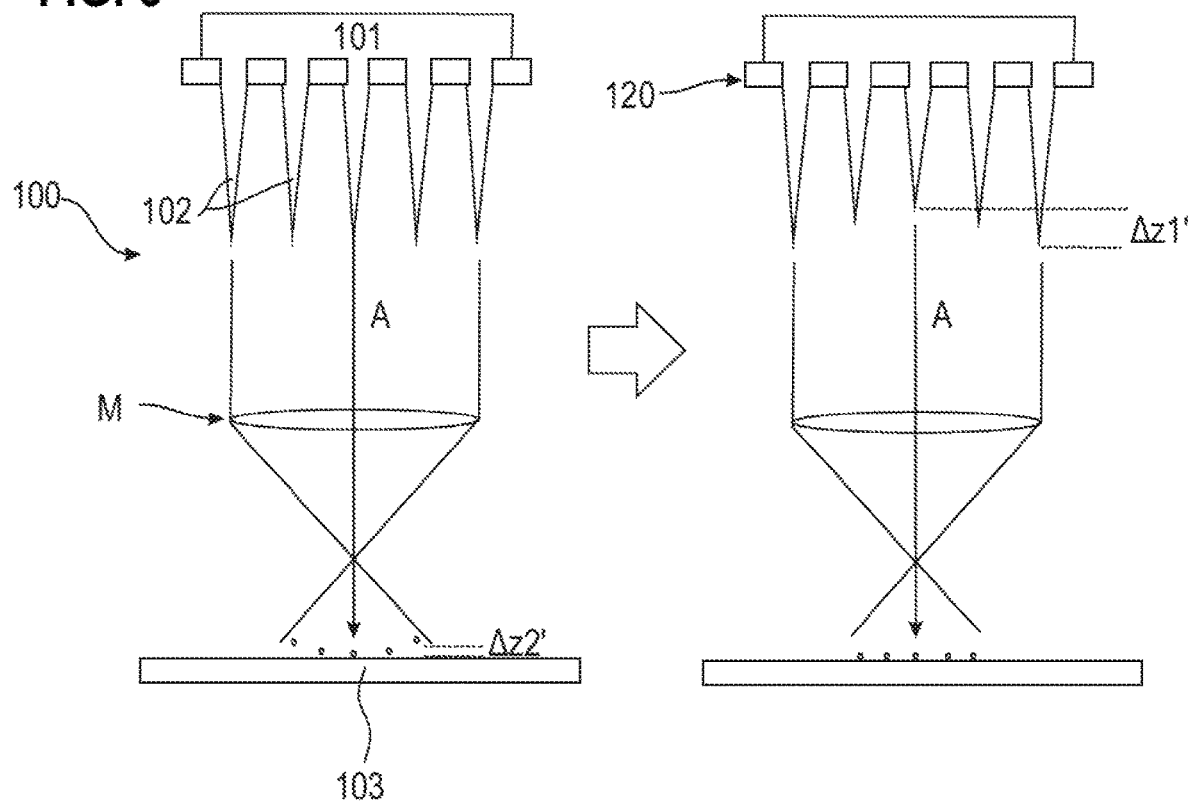
FIG. 3 is a schematic view for illustrating a field curvature correction in a second working mode of the charged particle beam device.

Referring now to FIG. 2 and to FIG. 3, the "field curvature" of a multi-beam system as well as the correction thereof will be briefly explained. FIG. 2 is a schematic view for illustrating a field curvature correction in a first working mode of a charged particle beam device, and FIG. 3 is a schematic view for illustrating a field curvature correction in a second working mode of the charged particle beam device. The first and second working modes may be characterized by specific settings of beam influencing components, e.g. working distances, charged particle energies, landing energies and/or the number of beamlets impinging on the specimen.

The field curvature is a beam aberration in charged particle beam devices that causes a specimen to appear sharp only in certain parts of the image, instead of being uniformly sharp across the image. A field curvature may be caused by optical components such as lenses in the beam path which project the image in a curved manner, rather than in a flat manner, as is schematically depicted in FIG. 2. As is depicted in the left part of FIG. 2, whereas the specimen 103 may be in the focal plane of a central beamlet propagating along the optical axis A, the foci of other beamlets more distant from the optical axis A may not lie in the plane of the specimen 103, but in front of the specimen, such that the respective regions of the specimen appear out of focus. The distance between the focus of the central beamlet and the focus of an outermost beamlet, as projected onto the optical axis A, is denominated as "$\Delta z2$" in FIG. 2 and represents the field curvature of the charged particle beam device 100 in the plane of the specimen in the first working mode.

The field curvature $\Delta z2$ may be compensated by a field curvature corrector 120 as described herein. The field curvature corrector 120 may focus the plurality of beamlets into an intermediate image plane at a beam energy $E_{Intermediate\ image}$, whereupon the plurality of beamlets are demagnified via conventional beam influencing components onto the specimen at a beam energy $E_{specimen}$ with demagnification M. The focal length variation in the intermediate image plane caused by the field curvature corrector 120 is denominated as $\Delta z1$ in the right part of FIG. 2 and is proportional to the focal length variation appearing in the plane of the specimen 103 (the "final image plane"). The focal length variation in the intermediate image plane translates from the intermediate image plane to the plane of the specimen according to the following equation $\Delta z_{intermediate\ image} = \Delta z_{specimen} \times M^2 \times (E_{Intermediate\ image}/E_{specimen})^{0.5}$.

Accordingly, when the field curvature corrector causes a focal length variation in the intermediate image plane of $\Delta z1$, the field curvature of $\Delta z2$ in the plane of the specimen can be compensated for, if $\Delta z1 = -\Delta z2 \times M^2 \times (E_{Intermediate\ image}/E_{specimen})^{0.5}$.

As is depicted in the right part of FIG. 2, due to the focal length variation caused by the field curvature corrector 120, the field curvature in the plane of the specimen 103 caused by the beam influencing components in the beam path can be compensated for, such that the foci of all the beamlets essentially lie in the plane of the specimen 103. The sharpness of the image can be improved.

FIG. 3 is a schematic view for illustrating a field curvature correction in a second working mode of the charged particle beam device. In the second working mode, the field curvature $\Delta z2'$ caused by the beam influencing elements in the beam path may be smaller than the field curvature $\Delta z2$ caused by the beam influencing elements in the first working mode of FIG. 2. According to embodiments described herein, the focal length variation provided by the field curvature corrector 120 can be adjusted to a different amount of $\Delta z1'$, such that $\Delta z1' = -\Delta z2' \times M^2$. Thus, the foci of the plurality of beamlets 102 all lie essentially in the plane of the specimen 103, and the sharpness of the image can be improved also in the second working mode, since the field curvature corrector 120 described herein is adjustable.

Returning to FIG. 1A, the strength of the field curvature correction provided by the field curvature corrector 120 can be adjusted as follows. The field curvature corrector 120 includes the adjustment device 132 configured to adjust at least one of the first electrical potential U1 of the first multi-aperture electrode 121 and the second electrical potential U2 of the second multi-aperture electrode 122. The second multi-aperture electrode 122 may be arranged downstream of the first multi-aperture electrode 121 in some embodiments. For example, a distance between the first multi-aperture electrode 121 and the second multi-aperture electrode 122 along the optical axis A may be 1 cm or less, or 5 mm or less. In particular, a variable voltage supply may be connected to the first multi-aperture electrode 121 and/or to the second multi-aperture electrode 122.

By adjusting the second electrical potential U2 of the second multi-aperture electrode 122, the focal length variation provided by the first multi-aperture electrode 121 can be adjusted. For example, in FIG. 1A, the second electrical potential U2 is set to a first value providing a first focal length variation of $\Delta z$, the focal length variation being defined as the difference between the focal length of a central beamlet and the focal length of an outermost beamlet caused by the field curvature corrector. The second electrical potential U2 may be set to a value that essentially compensates/corrects the field curvature caused by beam influencing elements of the charged particle beam device, such that a sharp image can be provided.

Figure 1B:
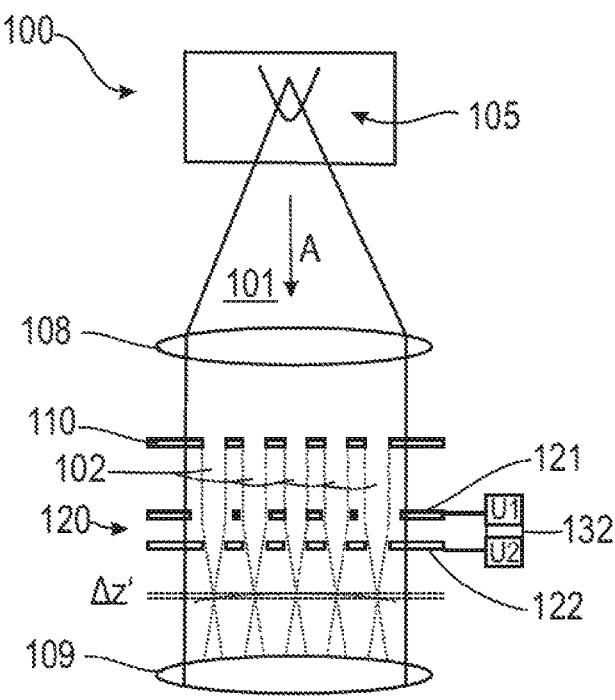
FIG. 1B is a schematic sectional view of the charged particle beam device of FIG. 1A with an adjusted field curvature correction.

As is schematically depicted in FIG. 1B, the second electrical potential U2 may be set to a second value providing a second focal length variation of $\Delta z1$ smaller than the first focal length variation $\Delta z$, the focal length variation being defined as the difference between the focal length of a central beamlet and the focal length of an outermost beamlet caused by the field curvature corrector. The second electrical potential U2 may be adjusted to a value that essentially compensates the field curvature caused by beam influencing elements of the charged particle beam device in a second working mode, such that a sharp image can be provided also in the second working mode.

In some embodiments, which can be combined with other embodiments described herein, the first plurality of openings of the first multi-aperture electrode 121 have diameters that vary as a function of the distance D from the optical axis A. In particular, a central opening of the first plurality of openings that is intersected by the optical axis A may be smaller, providing a stronger focusing effect, than outer openings of the first plurality of openings. In particular, the diameters of the first plurality of openings may increase with an increasing distance D from the optical axis, as is schematically depicted in the right part of FIG. 1A, showing a schematic top view of the first multi-aperture electrode 121.

In some embodiments, the diameters of the first plurality of openings may increase from a first diameter of 80 µm or less, e.g. of a central opening, to a second diameter of 100 µm or less, e.g. of outermost openings, or vice versa. More particularly, the central opening of the first multi-aperture electrode may have a diameter of 60 µm or less, and/or the diameters may increase with an increasing distance from the optical axis A to a second diameter of 110 µm or more.

In some embodiments, which can be combined with other embodiments described herein, the adjustment device may be configured to adjust a first electrical potential U1 of the first multi-aperture electrode 121 and to adjust the second electrical potential U2 of the second multi-aperture electrode 122, particularly independently of each other. For example, the adjustment device 132 may include a first voltage supply connected to the first multi-aperture electrode 121 and a second voltage supply connected to the second multi-aperture electrode 122.

For example, in order to provide a large field curvature correction, the first electrical potential U1 may be set to a high voltage, and the second electrical potential U2 may be set to a low voltage (e.g., the second multi-aperture electrode 122 may be grounded). For instance, the first electrical potential U1 may be set to 2 kV or more, particularly 4 kV or more, and the second multi-aperture electrode 122 may be grounded. A large amount of field curvature can be compensated or corrected.

In order to reduce the amount of field curvature correction, the first electrical potential U1 may be reduced and/or the second electrical potential U2 may be increased. For example, by reducing the first electrical potential U1 and by increasing the second electrical potential U2, the field curvature correction can be reduced, while the position of the foci of the plurality of beamlets in the intermediate image plane can be essentially kept stationary. Hence, the overall beam path is not severely affected by an adaption of the field curvature correction.

It is noted that, in some embodiments, the multi-aperture electrodes of the field curvature corrector have a focusing effect on the plurality of beamlets and generate an actual beam crossover downstream of the field curvature corrector. In other embodiments, a plurality of virtual foci may be provided by the multi-aperture electrodes of the field curvature corrector. For example, the plurality of beamlets may have virtual foci upstream or downstream of the specimen to be inspected.

According to embodiments described herein, a field curvature corrector 120 is provided which allows for an adaption of the amount of field curvature correction, while the focal length of the central beamlet can be essentially kept constant or kept within a certain range, by varying both the first potential U1 and the second potential U2 when changing the working mode of the device. Also the focal lengths of the radially outer beamlets and/or of any beamlet at a given distance from the optical axis may remain essentially constant.

For example, by setting the first potential U1 to a maximum voltage and by setting the second potential U2 to zero, a maximum field curvature correction can be provided. By setting the second potential U2 to the maximum voltage and by grounding the first potential U1, a reduced field curvature correction can be provided. The intermediate image plane can essentially be kept stationary.

Figure 4A:
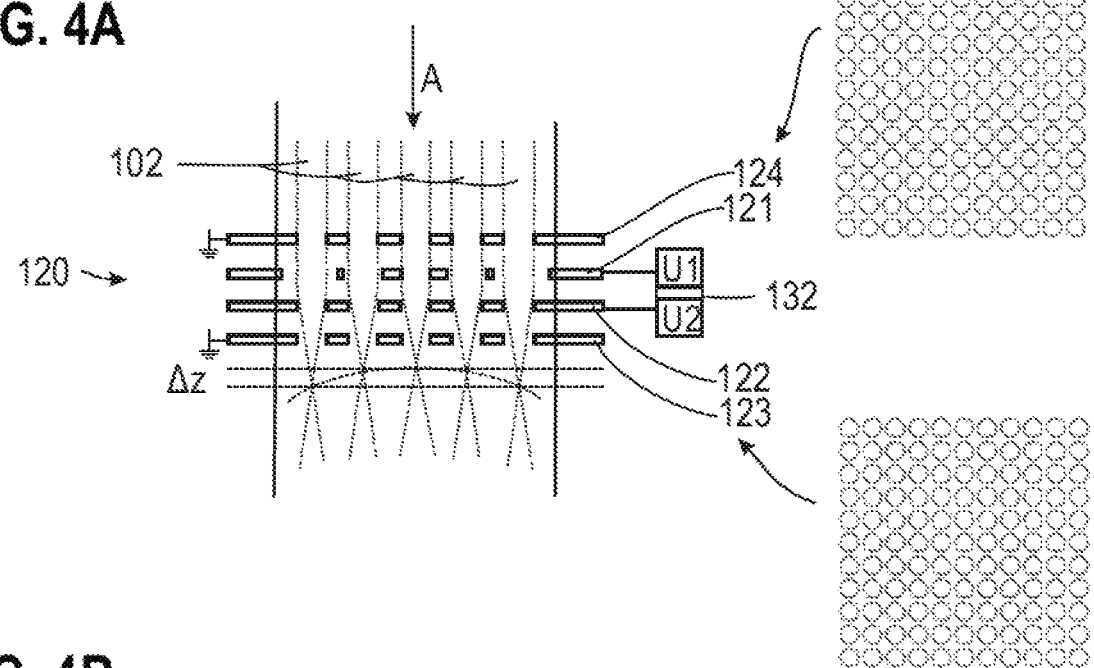
FIG. 4A is a schematic sectional view of a field curvature corrector according to embodiments described herein.

FIG. 4A is a schematic sectional view of a field curvature corrector 120 according to embodiments described herein. The field curvature corrector 120 of FIG. 4A may have some or all of the features of the field curvature corrector of FIG. 1A, such that reference can be made to the above explanations, which are not repeated here.

In particular, the field curvature corrector 120 of FIG. 4A includes a first multi-aperture electrode 121 with a first plurality of openings providing a varying focal length for a plurality of beamlets, a second multi-aperture electrode 122 with a second plurality of openings aligned with the first plurality of openings, and an adjustment device 132 configured to adjust at least one of the first electrical potential U1 of the first multi-aperture electrode 121 and the second electrical potential U2 of the second multi-aperture electrode 122.

In some embodiments, which may be combined with other embodiments described herein, the field curvature corrector 120 may further include a third multi-aperture electrode 123 with a third plurality of openings downstream of the first multi-aperture electrode 121 and the second multi-aperture electrode 122. Alternatively or additionally, the field curvature corrector 120 may further include a fourth multi-aperture electrode 124 with a fourth plurality of openings upstream of the first multi-aperture electrode 121 and the second multi-aperture electrode 122.

The third plurality of openings may have same diameters, and/or the fourth plurality of openings may have same diameters, as is schematically depicted in the right part of FIG. 4A.

In some embodiments, the third multi-aperture electrode 123 and/or the fourth multi-aperture electrode 124 may be grounded, as is schematically depicted in FIG. 4A. In particular, in some implementations, a grounded fourth multi-aperture electrode 124 may be arranged upstream of the first multi-aperture electrode 121, and a grounded third multi-aperture electrode 123 may be arranged downstream of the second multi-aperture electrode 122.

The fourth multi-aperture electrode 124, the first multi-aperture electrode 121, the second multi-aperture electrode 122, and the third multi-aperture electrode 123 may be aligned with each other, such that the plurality of beamlets subsequently propagate through the fourth plurality of openings, the first plurality of openings, the second plurality of openings, and the third plurality of openings.

When the fourth multi-aperture electrode 124 and the third multi-aperture electrode 123 are grounded, the field curvature corrector 120 has essentially the effect of an array of einzel lenses which focus the plurality of beamlets without changing the energy of the beamlets. Accordingly, the charged particles exiting the field curvature corrector 120 essentially have the same energy as the charged particles entering the field curvature corrector 120.

An einzel lens conventionally consists of three or more electrodes with cylindrical openings in series along the optical axis. The electrostatic potential in an einzel lens is symmetric such that the charged particles regain the initial energy upon exiting the einzel lens. In particular, the first electrode and the last electrode of an einzel lens may be grounded or may be provided on the same potential. In an einzel lens, the radial velocity of the radially outer charged particles is altered by at least one central electrode such that the outer charged particles converge toward the optical axis.

As is schematically depicted in FIG. 4A, the field curvature corrector 120 according to embodiments described herein includes at least four multi-aperture electrodes arranged in series along the optical axis A. The two outer multi-aperture plates (i.e. the third and fourth multi-aperture plates) may be grounded or provided on same potentials, and at least two inner multi-aperture plates (i.e. the first and second multi-aperture plates) may be set on different electrical potentials, providing a focusing effect on the plurality of beamlets that depends on a distance of a respective beamlet from the optical axis A. Accordingly, the field curvature corrector 120 has the effect of an array of einzel lenses configured to provide a varying focal length on a plurality of beamlets propagating next to each other, essentially without changing the beamlet energies.

The strength of the field curvature corrector can be adjusted essentially without changing the focal length of the field curvature corrector, by varying the first potential U1 and the second potential U2 in opposite directions.

Figure 4B:
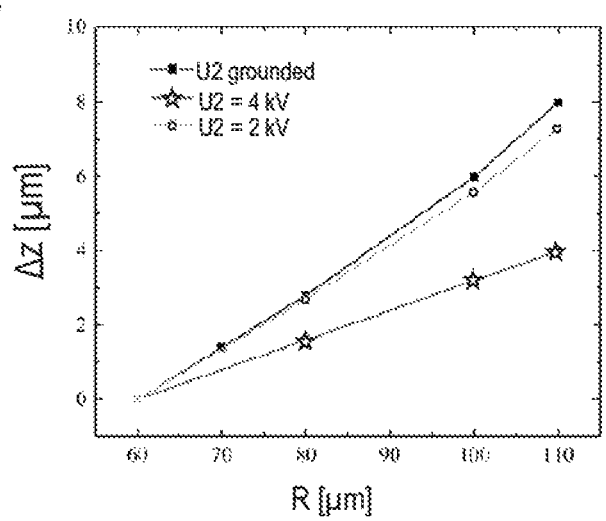
FIG. 4B is a graph illustrating a field curvature correction of the field curvature corrector of FIG. 4A at different potential settings.

FIG. 4B is a graph illustrating the field curvature correction of the field curvature corrector 120 of FIG. 4A for different settings of the second potential U2. The graph shows the differences in focal lengths (in μm, y-axis) provided by the field curvature corrector as a function of the diameters R (in μm, x-axis) of the apertures of the first multi-aperture electrode 121. As can be seen from FIG. 4B, the focal lengths provided by the field curvature corrector differ by approximately 8 μm between a central opening having a diameter of about 60 μm and an outer opening having a diameter of about 110 μm, when the second multi-aperture electrode 122 is grounded ($U_2$ grounded, see line marked with rectangles in FIG. 4B). An increase of the second potential $U_2$ (and a decrease of the first potential $U_1$) leads to a reduced focal length variation Δz between the central aperture and the outer apertures. The field curvature correction can be decreased ($U_2$=2 kV, see line marked with circles in FIG. 4B, $U_2$=4 kV, see line marked with stars in FIG. 4B).

Figure 5A:
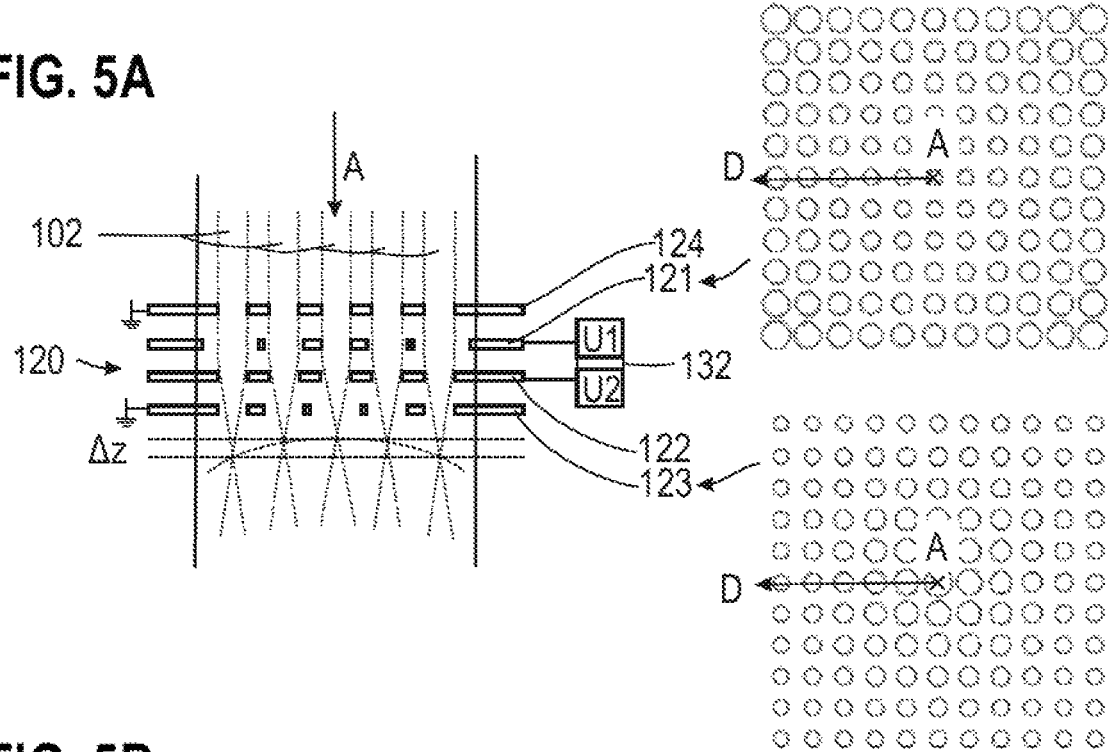
FIG. 5A is a schematic sectional view of a field curvature corrector according to embodiments described herein.

FIG. 5A is a schematic sectional view of a field curvature corrector 120 according to embodiments described herein. The field curvature corrector 120 of FIG. 5A may have some or all of the features of the field curvature corrector of FIG. 4A, such that reference can be made to the above explanations, which are not repeated here.

In particular, the field curvature corrector 120 of FIG. 5A includes a first multi-aperture electrode 121 with a first plurality of openings providing a varying focal length on a plurality of beamlets, a second multi-aperture electrode 122 with a second plurality of openings aligned with the first plurality of openings, and an adjustment device 132 configured to adjust at least one of the first electrical potential U1 of the first multi-aperture electrode 121 and the second electrical potential U2 of the second multi-aperture electrode 122. Further, a third multi-aperture electrode 123 with a third plurality of openings is provided. Further, a fourth multi-aperture electrode 124 with a fourth plurality of openings may be provided, wherein the third and fourth multi-aperture electrodes may be grounded.

According to embodiments, which may be combined with other embodiments described herein, the third plurality of openings of the third multi-aperture electrode 123 have diameters that vary as a second function of the distance D from the optical axis A.

In some implementation, the second function is essentially an inverse of the (first) function that specifies the variation of the diameters of the first plurality of openings of the first multi-aperture plate 121. In particular, the diameters of the first plurality of openings may increase with an increasing distance from the optical axis A, and the diameters of the third plurality of openings may decrease with an increasing distance D from the optical axis A, or vice versa.

In particular, the diameters of the third plurality of openings may vary from the center to the outer regions in a way which is inverse to the variation of the diameters of the first plurality of openings from the center to the outer regions. In this way, the field curvature correction can be adjusted from a large correction (U1 high, U2 grounded) to zero correction (U2 high, U1 grounded). In the "large correction mode" (U1 high, U2 grounded), the field curvature correction is being achieved in a similar way as described above, and the varying diameters of the third multi-aperture electrode 123 have essentially no effect. In the "zero correction mode" (U2 high, U1 grounded), the focal length variation introduced by the first multi-aperture electrode 121 is reduced, and in addition an inverse focal length variation is introduced by the third multi-aperture electrode 123. If the opening diameters are set properly, the net focal length for all beamlets of the plurality of beamlets is equal, resulting in no residual field curvature correction. Yet, the focal length provided by the field curvature corrector can be essentially kept constant when varying the first and second potentials as specified above.

Figure 5B:
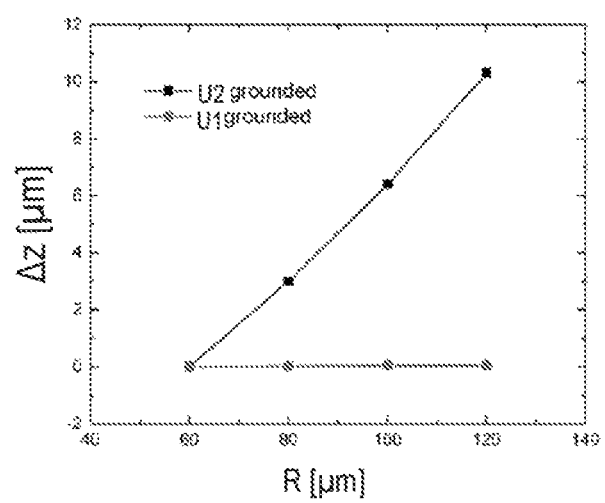
FIG. 5B is a graph illustrating a field curvature correction of the field curvature corrector of FIG. 5A at different potential settings.

FIG. 5B is a graph illustrating the field curvature correction of the field curvature corrector 120 of FIG. 5A for different settings of the first potential U1 and the second potential U2. The graph shows the differences in focal lengths (in μm, y-axis) provided by the field curvature corrector as a function of the diameters R (in μm, x-axis) of the apertures of the first multi-aperture electrode 121. As can be seen from FIG. 5B, the focal lengths provided by the field curvature corrector differ by approximately 10 μm between a central opening having a diameter of about 60 μm and an outer opening having a diameter of about 120 μm, when the second multi-aperture electrode 122 is grounded ($U_2$ grounded) and the first multi-aperture is set on a potential >0 ($U_1$ high, e.g. 4 kV or more). An increase of the second potential $U_2$ and a decrease of the first potential $U_1$ lead to a reduced focal length variation Δz between the central aperture and the outer apertures. The field curvature correction can be decreased. The field curvature correction can be set to "zero correction" by grounding the first multi-aperture electrode 121 ($U_1$ grounded) and setting the second multi-aperture on a potential >0 ($U_2$ high, e.g. 4 kV or more). Yet, the intermediate image plane in which the field curvature corrector focuses can be kept essentially constant.

According to embodiments described herein, the field curvature correction provided by a field curvature corrector 120 can be adjusted, e.g. when operating the charged particle beam device in different working modes. At the same time, an intermediate image plane can be maintained at a constant position in different working modes of the charged particle beam device, such that the overall beam path does not substantially vary between the working modes.

Figure 6:
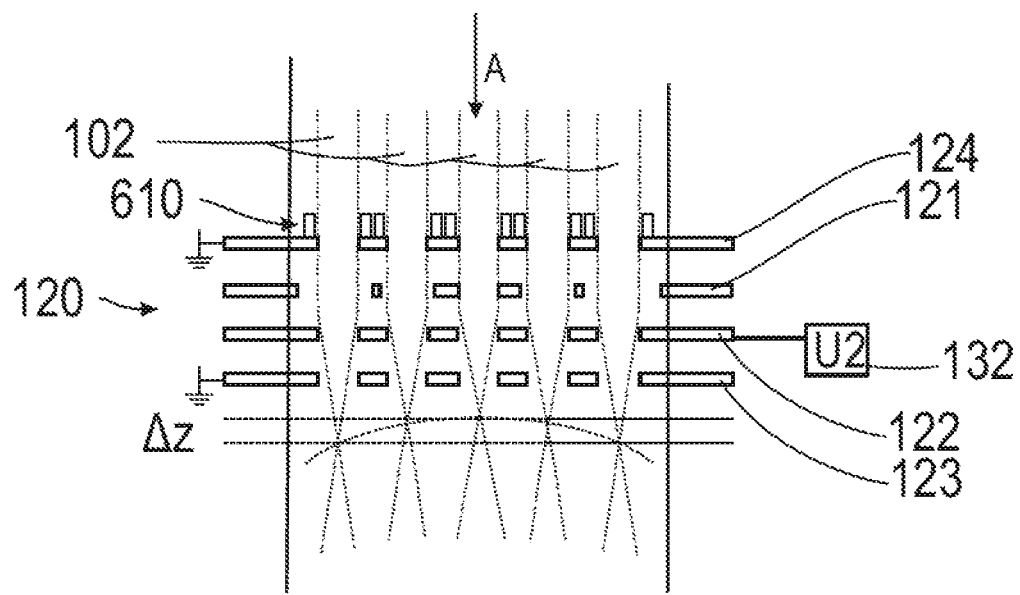
FIG. 6 is a schematic sectional view of a field curvature corrector according to embodiments described herein.

FIG. 6 is a schematic sectional view of a field curvature corrector 120 according to embodiments described herein. The field curvature corrector 120 of FIG. 6 may have some or all of the features of the field curvature corrector of FIG. 5A, such that reference can be made to the above explanations, which are not repeated here.

The field curvature corrector 120 depicted in FIG. 6 further includes an electrostatic multipole device 610 including at least one multipole unit for each of the plurality of beamlets 102. The multipole units may be configured for at least one of aberration correction of the plurality of beamlets, deflection of the plurality of beamlets, or blanking of the plurality of beamlets. For example, each of the plurality of beamlets may be deflected individually, such that the plurality of beamlets appear to come from different sources. According to another example, spherical aberrations or higher order aberrations of the plurality of beamlets 102 may be individually compensated with the multipole units.

In the embodiment depicted in FIG. 6, the electrostatic multipole device 610 is arranged upstream of the field curvature corrector 120. Additionally or alternatively, a (further) electrostatic multipole device may be arranged downstream of the field curvature corrector 120.

In some implementations, the multipole units of the electrostatic multipole device 610 may be selected from the group consisting of electrostatic dipoles, quadrupoles, hexapoles, and octupoles. For example, at least one electrostatic octupole may be provided for each of the plurality of beamlets, such that each beamlet can be individually influenced, e.g. deflected or corrected. In some embodiments, higher order electrostatic multipole elements may be provided, such as multipoles with 12, 14 or 20 poles.

In some embodiments, which may be combined with other embodiments described herein, a multipole device may be provided for influencing the charged particle beam propagating along the optical axis, e.g. downstream or upstream of the field curvature corrector. The multipole device may include an electrostatic corrector having four or more corrector electrodes, particularly eight or more corrector electrodes, more particularly 12 or more corrector electrodes, or even 20 or more corrector electrodes. High order aberrations can be corrected or compensated. The corrector electrodes of the electrostatic corrector may be arranged in a plane essentially perpendicular to the optical axis of the charged particle beam device, e.g. on top of one of the multi-aperture electrodes of the field curvature corrector.

In some embodiments, the multipole device may further include an electrostatic deflector with at least two deflector electrodes for deflecting the charged particle beam by a deflection angle. The electrostatic deflector may be arranged directly upstream or directly downstream of the electrostatic corrector. For example, the deflector electrodes may extend over a first length along the optical axis, and/or the corrector electrodes of the electrostatic corrector may extend over a second length along the optical axis, the second length being smaller than the first length.

In some embodiments, a distance between a projection of the deflector electrodes on the optical axis and a projection of the corrector electrodes on the optical axis is smaller than the first length so that, during operation of the multipole device, first fringe fields generated by the deflector electrodes and second fringe fields generated by the corrector electrodes spatially overlap. In some embodiments, the electrostatic corrector is configured to compensate for an aberration of the charged particle beam caused by the electrostatic deflector In the embodiment depicted in FIG. 6, the multipole units of the electrostatic multipole device 610 are provided at a beam entrance surface of the field curvature corrector 120 directed in an upstream direction. For example, the multipole units may be integrally formed at a surface of the fourth multi-aperture electrode 124 directed toward the beam source. Alternatively or additionally, the multipole units of the electrostatic multipole device 610 may be provided at a beam exit surface of the field curvature corrector 120 directed in a downstream direction. For example, the multipole units may be integrally formed at a surface of the third multi-aperture electrode 123 directed toward the specimen.

Accordingly, not only the field curvature, but also other beam aberrations of the plurality of beamlets can be individually corrected.

Figure 7:
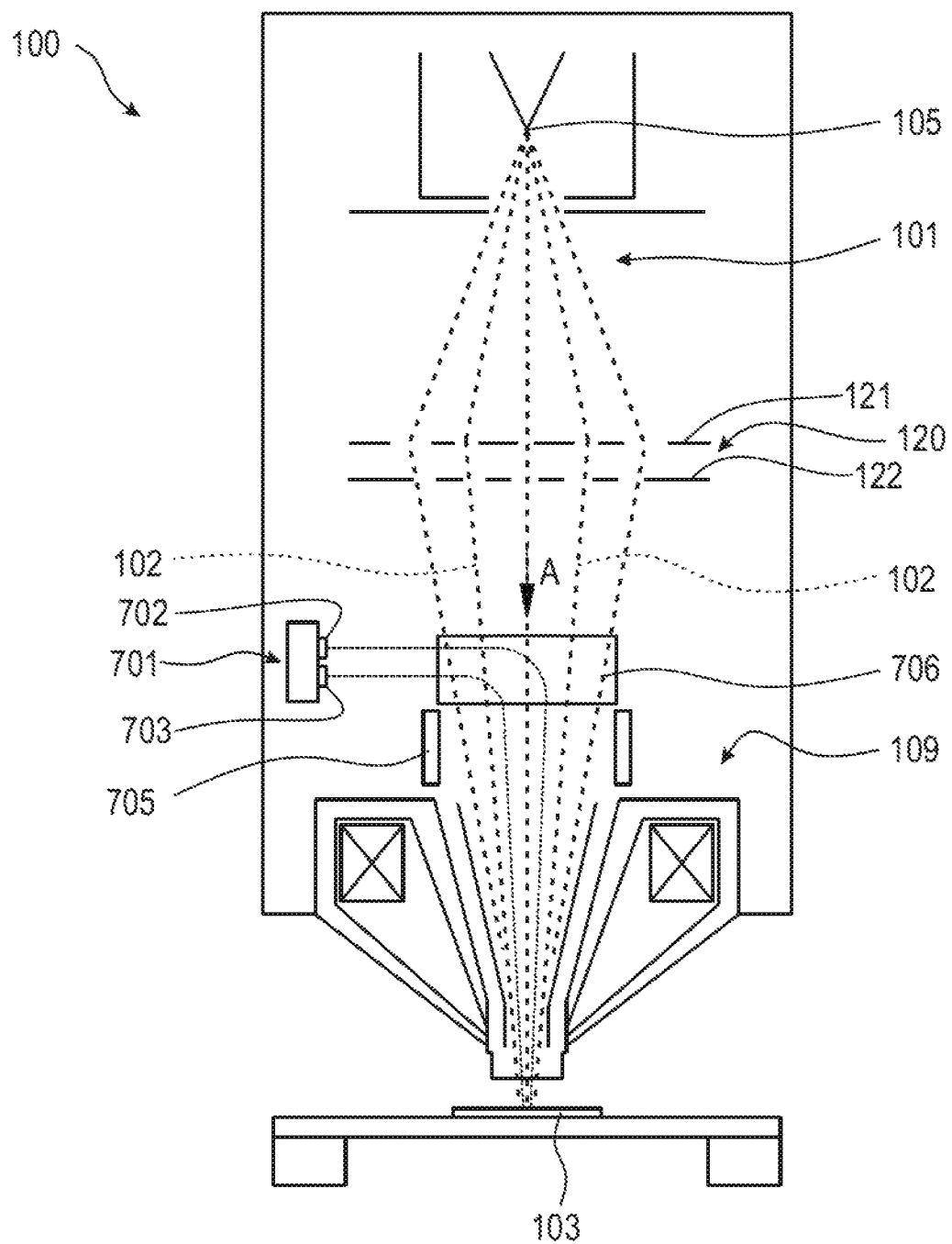
FIG. 7 is a schematic sectional view of a charged particle beam device according to embodiments described herein.

FIG. 7 is a schematic sectional view of a charged particle beam device 100 according to embodiments described herein. The charged particle beam device 100 may be a scanning electron microscope in some embodiments.

The charged particle beam device 100 includes a beam source 105, e.g. an electron source configured to generate a charged particle beam 101 propagating along an optical axis A, and a field curvature corrector 120 according to any of the embodiments described herein. The field curvature corrector 120 may be an adjustable field curvature corrector 120, such that the field curvature correction provided by the field curvature corrector 120 can be adjusted to the working mode of the charged particle beam device.

The charged particle beam device 100 further includes beam influencing elements selected from the group consisting of a collimation lens, a transfer lens, an objective lens, an electrode, a multipole device, a deflector, and a scan deflector.

According to embodiments described herein, the second electrical potential of the second multi-aperture electrode 122 of the field curvature corrector can be adjusted such that a first field curvature introduced by the field curvature corrector 120 is set inverse to a second field curvature caused by one or more of the beam influencing elements. Accordingly, the field curvature correction can be adapted to different working modes of the charged particle beam device.

As is schematically depicted in FIG. 7, the charged particle beam device 100 further includes an objective lens system 109 figured to focus the plurality of beamlets 102 onto a specimen 103, and a segmented detector 701 configured to detect signal particles emitted from the specimen 103. The segmented detector 701 may include a plurality of detector segments configured to detect the signal particles generated upon impingement of the plurality of beamlets on the specimen. A first detector segment 702 and a second detector segment 703 are schematically depicted in FIG. 7, wherein the first detector segment 702 is arranged to detect the signal particles generated by a first beamlet of the plurality of beamlets, and the second detector segment 703 is arranged to detect the signal particles generated by a second beamlet of the plurality of beamlets. A spatially resolved image can be generated, and/or the inspection speed can be increased by parallel inspection.

The objective lens system 109 may include a combined magnetic-electrostatic objective lens including a magnetic lens portion and an electrostatic lens portion. In some embodiments, a retarding field device may be provided which is configured to reduce the landing energy of the charged particles on the specimen. For example, a retarding field electrode may be arranged upstream of the specimen.

According to embodiments, which may be combined with other embodiments described herein, the beam source 105 is an electron source, the charged particle beam is an electron beam, and the charged particle beam device 100 is a scanning electron microscope (SEM).

According to other embodiments, the charged particle beam device 100 is another type of electron microscope. According to yet further embodiments, the charged particle beam device is an ion beam device, the beam source is an ion source, and the charged particle beam is an ion beam.

A scanning electron microscope (SEM) as described herein is configured for imaging a specimen. The scanning electron microscope includes a beam source configured to generate a beam of electrons propagating along an optical axis, a field curvature corrector 120 as described herein, and a scan deflector 705 configured for scanning the plurality of beamlets 102 over the specimen 103.

According to one aspect described herein, a field curvature corrector 120 for a multi-beam charged particle device 100 as described herein is provided. The field curvature corrector 120 includes a first multi-aperture electrode 121 with a first plurality of openings for a plurality of beamlets of charged particles propagating next to each other, a second multi-aperture electrode 122 with a second plurality of openings for the plurality of beamlets, and an adjustment device 132 configured to adjust a second electrical potential U2 of the second multi-aperture electrode for adjusting a strength of a field curvature correction.

In some embodiments, an aperture device 110 with a plurality of openings to create the plurality of beamlets is arranged upstream of the field curvature corrector 120. In other embodiments, the plurality of beamlets are created by the field curvature corrector 120, e.g. by one of the multi-aperture electrodes of the field curvature corrector. For example, the first multi-aperture electrode 121, the second multi-aperture electrode 122, or another multi-aperture electrode of the field curvature corrector may be configured to create the plurality of beamlets from the charged particle beam.

The first multi-aperture electrode 121 provides a focal length on the plurality of beamlets that varies with a distance D from an optical axis A, wherein the optical axis A is defined by a central opening of the field curvature corrector 120. In other words, a beamlet propagating close to the optical axis A through the first multi-aperture electrode device 121 is focused differently (i.e. with a different focal length) from a beamlet propagating distant from the optical axis A through the first multi-aperture device.

In particular, the first plurality of openings may have varying diameters. More particularly, the diameters of the first plurality of openings vary as a function of the distance D from the optical axis. In particular, the diameters of the first plurality of openings increase with an increasing distance from the optical axis A.

The field curvature corrector 120 may include further features described herein, e.g. a third multi-aperture electrode 123 and/or a fourth multi-aperture electrode 124 as described herein, such that reference can be made to the above explanations.

In some embodiments, a beam separator 706 is provided for separating the signal electrons which are emitted from the specimen from the electrons of the charged particle beam 101 propagating toward the specimen. The beam separator may for example be a magnetic beam separator or a Wien filter.

According to another aspect described herein, methods of operating a charged particle beam device are provided.

Figure 8:
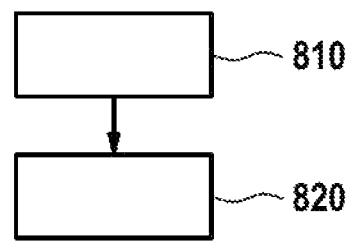
FIG. 8 is a flow diagram illustrating a method of operating a charged particle beam device according to embodiments described herein.

FIG. 8 is a flow diagram illustrating a method of operating a charged particle beam device according to embodiments described herein. In box 810, the method includes adjusting a field curvature corrector 120 to a first working mode of the charged particle beam device, and operating the charged particle beam device in the first working mode. In box 820, the method includes adjusting the field curvature corrector to a second working mode of the charged particle beam device, and operating the charged particle beam device in the second working mode. The field curvature corrector 120 may include some or all of the features of any of the field curvature correctors described herein, such that reference can be made to the above explanations, which are not repeated here.

A first field curvature of the plurality of beamlets that is compensated in the first working mode by the field curvature corrector 120 is different from a second field curvature of the plurality of beamlets that is compensated in the second wording mode by the field curvature corrector 120.

At least one beam characteristic or beam parameter of the plurality of beamlets in the first working mode and in the second working mode may be different. For example, the charged particle beam device may be operated at a first working distance and/or at a first landing energy in the first working mode, and the charged particle beam device may be operated at a second working distance and/or at a second landing energy in the second working mode.

According to embodiments described herein, adjusting the field curvature corrector 120 includes adjusting a second electrical potential of a second multi-aperture electrode 122 arranged downstream of a first multi-aperture electrode 121. The first multi-aperture electrode provides a focusing effect on a plurality of beamlets that depends on a distance of a respective beamlet from the optical axis A and/or that varies a function of a distance D from an optical axis A. The optical axis A is typically defined by a central opening of the field curvature corrector 120. Additionally, a first electrical potential U1 of the first multi-aperture electrode 121 can be adjusted by a respective voltage supply of the adjustment device.

In particular, the diameters of the first plurality of openings may increase (or decrease) with an increasing distance from the optical axis A.

Figure 9:
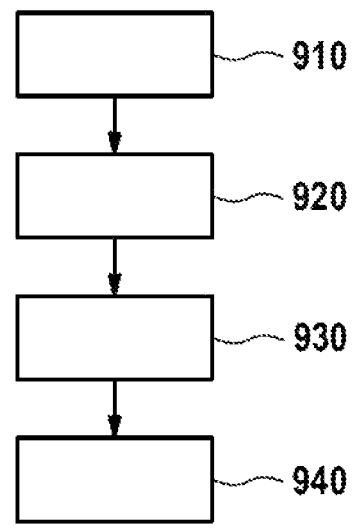
FIG. 9 is a flow diagram illustrating a method of operating a charged particle beam device according to embodiments described herein.

FIG. 9 is a flow diagram illustrating a method of operating a charged particle beam device according to embodiments described herein.

In box 910, a charged particle beam is generated which propagates along an optical axis A.

In box 920, a plurality of beamlets is created from the charged particle beam, particularly with an aperture device including a plurality of apertures.

In box 930, a field curvature is compensated with a field curvature corrector 120 as described herein.

In box 940, the plurality of beamlets are focused onto a specimen.

Compensating the field curvature in box 930 includes focusing the plurality of beamlets with a first multi-aperture electrode 121 having a first plurality of openings providing a focusing effect that varies as a function of a distance from the optical axis. In particular, the diameters of the first plurality of openings may vary as a function of a distance from the optical axis.

A second electrical potential of a second multi-aperture electrode 122 with a second plurality of openings arranged downstream of the first multi-aperture electrode 121 may be adjusted such that a field curvature in the plane of a specimen to be inspected is essentially zero. Accordingly, the foci of all the beamlets of the plurality of beamlets may lie in the plane of the specimen, such that a sharp image of the specimen can be provided in different working modes of the charged particle beam device.

The method may further include detecting signal charged particles emitted by the specimen, particularly secondary charged particles and/or backscattered particles, wherein the signal charged particles generated by each of the beamlets are individually detected via a segmented detector device.

While the foregoing is directed to specific embodiments, other and further embodiments may be devised without departing from the basic scope thereof, and the scope thereof is determined by the claims that follow.

The invention claimed is:

1. A charged particle beam device, comprising:
   a beam source configured to generate a charged particle beam propagating along an optical axis (A);
   an aperture device with a plurality of apertures configured to create a plurality of beamlets from the charged particle beam; and
   a field curvature corrector, comprising:
      a first multi-aperture electrode with a first plurality of openings for the plurality of beamlets, the first plurality of openings having diameters that vary as a function of a distance from the optical axis (A);
      a second multi-aperture electrode with a second plurality of openings for the plurality of beamlets;
      a third multi-aperture electrode with a third plurality of openings downstream of the first multi-aperture electrode and the second multi-aperture electrode, wherein the third plurality of openings have diameters that vary as a second function of the distance from the optical axis (A);
      a fourth multi-aperture electrode with a fourth plurality of openings upstream of the first multi-aperture electrode and the second multi-aperture electrode; and
      an adjustment device configured to adjust at least one of a first electrical potential (U1) of the first multi-aperture electrode and a second electrical potential (U2) of the second multi-aperture electrode,
      wherein (i) the second plurality of openings have same diameters, (ii) the fourth plurality of openings have same diameters, or (iii) the second plurality of opening have same diameters and the fourth plurality of openings have same diameters.

2. The charged particle beam device of claim 1, wherein the adjustment device is configured to adjust the first electrical potential (U1) and the second electrical potential (U2).

3. The charged particle beam device of claim 1, wherein the diameters of the first plurality of openings increase with the distance from the optical axis, particularly from a first diameter of 80 μm or less to a second diameter of 100 μm or more.

4. The charged particle beam device of claim 1, wherein the third multi-aperture electrode and the fourth multi-aperture electrode are grounded.

5. The charged particle beam device of claim 1, wherein the second function is essentially an inverse of the function.

6. The charged particle beam device of claim 1, wherein the diameters of the first plurality of openings increase with the distance from the optical axis, and diameters of the third plurality of openings decrease with the distance from the optical axis, or vice versa.

7. The charged particle beam device of claim 1, further comprising one or more beam influencing elements selected from the group consisting of a collimation lens, a transfer lens, an objective lens, a multipole device, a deflector, and a scan deflector.

8. The charged particle beam device of claim 7, wherein the second electrical potential is adjustable such that a first field curvature introduced by the field curvature corrector (120) is essentially inverse to a second field curvature caused by the one or more beam influencing elements.

9. The charged particle beam device of claim 1, further comprising an electrostatic multipole device comprising a multipole unit for each of the plurality of beamlets, wherein the multipole units are provided at a beam entrance surface of the field curvature corrector or at a beam exit surface of the field curvature corrector.

10. The charged particle beam device of claim 1, wherein the beam source is an electron source, the charged particle beam is an electron beam, and the charged particle beam device is a scanning electron microscope.

11. A field curvature corrector, comprising:
    a first multi-aperture electrode with a first plurality of openings for a plurality of beamlets of charged particles propagating next to each other, the first plurality of openings having varying diameters;
    a second multi-aperture electrode with a second plurality of openings for the plurality of beamlets;
    a third multi-aperture electrode with a third plurality of openings downstream of the first multi-aperture electrode and the second multi-aperture electrode, wherein the third plurality of openings have diameters that vary as a second function of the distance from the optical axis (A);
    a fourth multi-aperture electrode with a fourth plurality of openings upstream of the first multi-aperture electrode and the second multi-aperture electrode; and
    an adjustment device configured to adjust at least one of a first electrical potential of the first multi-aperture electrode and a second electrical potential of the second multi-aperture electrode,
    wherein (i) the second plurality of openings have same diameters, (ii) the fourth plurality of openings have same diameters or (iii) the second plurality of opening have same diameters and the fourth plurality of openings have same diameters.

12. A method of operating a charged particle beam device, comprising:
    generating a charged particle beam propagating along an optical axis;
    creating a plurality of beamlets from the charged particle beam;
    compensating for a field curvature with the field curvature corrector according to claim 11, comprising:
       focusing the plurality of beamlets with the first multi-aperture electrode of the field curvature corrector; and adjusting, with the adjustment device of the field curvature corrector, at least one of the first electrical potential and the second electrical potential; and focusing the plurality of beamlets onto a specimen.

13. The method of claim 12, further comprising:

detecting signal charged particles emitted by the specimen, wherein the signal charged particles generated by each of the beamlets are individually detected via a segmented detector device.

14. A charged particle beam device, comprising:

a beam source for generating a charged particle beam; and a field curvature corrector, comprising:

a first multi-aperture electrode with a first plurality of openings having varying diameters;

a second multi-aperture electrode with a second plurality of openings;

a third multi-aperture electrode with a third plurality of openings downstream of the first multi-aperture electrode and the second multi-aperture electrode, wherein the third plurality of openings have varying diameters; and a fourth multi-aperture electrode with a fourth plurality of openings upstream of the first multi-aperture electrode and the second multi-aperture electrode; and an adjustment device for adjusting at least one of a first electrical potential ($U1$) of the first multi-aperture electrode and a second electrical potential ($U2$) of the second multi-aperture electrode, wherein (i) the second plurality of openings have same diameters, the (ii) fourth plurality of openings have same diameters, or (iii) the second plurality of opening have same diameters and the fourth plurality of openings have same diameters.

15. The charged particle beam device of claim 14, wherein the third multi-aperture electrode and the fourth multi-aperture electrode are provided on same potentials or are grounded, and the adjustment device is configured to adjust the second electrical potential of the second multi-aperture electrode.

16. The charged particle beam device of claim 14, wherein the adjusting with the adjustment device adjusts the strength of a field curvature correction in different working modes of the charged particle beam device.

* * * * *